United States Patent
Duan et al.

(10) Patent No.: US 11,804,826 B2
(45) Date of Patent: Oct. 31, 2023

(54) SEMICONDUCTOR DEVICES WITH FLEXIBILITY IN CAPACITOR DESIGN FOR POWER NOISE REDUCTION

(71) Applicant: MediaTek Singapore Pte. Ltd., Singapore (SG)

(72) Inventors: Zhigang Duan, Singapore (SG); Yung-Ching Chen, Hsinchu (TW); Chang Liang, Singapore (SG); Jinghao Chen, Singapore (SG)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 17/727,825

(22) Filed: Apr. 25, 2022

(65) Prior Publication Data

US 2022/0345113 A1    Oct. 27, 2022

Related U.S. Application Data

(60) Provisional application No. 63/180,148, filed on Apr. 27, 2021.

(51) Int. Cl.
| | |
|---|---|
| *H03K 3/012* | (2006.01) |
| *H01L 23/495* | (2006.01) |
| *H01L 25/18* | (2023.01) |
| *H01L 23/00* | (2006.01) |
| *H01L 25/16* | (2023.01) |

(52) U.S. Cl.
CPC ....... *H03K 3/012* (2013.01); *H01L 23/49589* (2013.01); *H01L 25/18* (2013.01); *H01L 24/16* (2013.01); *H01L 25/16* (2013.01); *H01L 2924/19103* (2013.01); *H01L 2924/19106* (2013.01)

(58) Field of Classification Search
None
See application file for complete search history.

(56) References Cited

U.S. PATENT DOCUMENTS

| | | | | |
|---|---|---|---|---|
| 6,967,416 B2* | 11/2005 | Clevenger | ............. | H01L 23/367 |
| | | | | 257/E23.102 |
| 7,110,316 B2* | 9/2006 | Choi | ...................... | G11C 5/147 |
| | | | | 365/189.11 |
| 7,667,487 B2* | 2/2010 | Bartley | ..................... | G06F 1/26 |
| | | | | 326/38 |

(Continued)

*Primary Examiner* — Jeffery S Zweizig
(74) *Attorney, Agent, or Firm* — Winston Hsu

(57) ABSTRACT

A semiconductor device includes a first functional block configured to provide a first predetermined function, a second functional block configured to provide a second predetermined function, a first capacitive device, a second capacitive device, a first coupling path, a first switch device and a second switch device. The first capacitive device is disposed physically proximate the first functional block. The second capacitive device is disposed physically proximate the second functional block. The first coupling path includes at least a first connection node connecting to the first functional block. The first switch device is controlled to selectively connect the first capacitive device to the first connection node. The second switch device is controlled to selectively connect the second capacitive device to the second functional block or a second connection node. The second connection node is disposed on the first coupling path and connecting to the first connection node.

20 Claims, 6 Drawing Sheets

(56) References Cited

U.S. PATENT DOCUMENTS

| | | | |
|---|---|---|---|
| 9,459,672 B2 * | 10/2016 | Kim | ............... G06F 1/26 |
| 2004/0007918 A1 | 1/2004 | Clevenger | |
| 2009/0179669 A1 | 7/2009 | Bartley | |

* cited by examiner

SEMICONDUCTOR DEVICES WITH FLEXIBILITY IN CAPACITOR DESIGN FOR POWER NOISE REDUCTION

CROSS REFERENCE TO RELATED APPLICATIONS

This application claims the benefit of U.S. Provisional Application No. 63/180,148, filed on Apr. 27, 2021. The content of the application is incorporated herein by reference.

BACKGROUND

Decoupling capacitor is a capacitor installed at power supply end of a component in a circuit. This capacitor can provide a relatively stable power supply, and at the same time, it can reduce the noise coupled from the component to the power supply terminal (that is, decoupling the noise), which can indirectly reduce the influence of other components by the noise of this component. Large decoupling capacitor usually provides greater power noise reduction performance. However, the cost gets higher and the circuit area increases as well.

With the explosion of mobile phones, tablets and other portable electronic devices, the need for smaller form factor products with better electrical performance motivates the research in the decoupling capacitor design. Therefore, a semiconductor device with flexibility in capacitor design to achieve better electrical performance is highly required.

SUMMARY

According to an embodiment of the invention, a semiconductor device comprises a first functional block, a second functional block, a first capacitive device, a second capacitive device, a first coupling path, a first switch device and a second switch device. The first functional block is configured to provide at least a first predetermined function. The second functional block is configured to provide at least a second predetermined function. The first capacitive device is disposed physically proximate the first functional block. The second capacitive device is disposed physically proximate the second functional block. The first coupling path comprises at least a first connection node connecting to the first functional block. The first switch device is coupled to the first capacitive device and controlled to selectively connect the first capacitive device to the first connection node. The second switch device is coupled to the second capacitive device and controlled to selectively connect the second capacitive device to the second functional block or a second connection node. The second connection node is disposed on the first coupling path and connecting to the first connection node.

According to another embodiment of the invention, a semiconductor device comprises a first functional block, a second functional block, a first capacitive device, a second capacitive device, a first coupling path, a first switch device and a second switch device. The first functional block is configured to provide at least a first predetermined function. The second functional block is configured to provide at least a second predetermined function. The first capacitive device is disposed physically proximate the first functional block. The second capacitive device is disposed physically proximate the second functional block. The first coupling path comprises at least a first connection node connecting to the first functional block. The first switch device is coupled to the first capacitive device and controlled to selectively connect the first capacitive device to the first connection node. The second switch device is coupled to the second capacitive device and controlled to selectively connect the second capacitive device to the second functional block or a second connection node. The second connection node is disposed on the first coupling path and connecting to the first connection node. When the first functional block is determined in a heavy load condition, the second switch device is controlled to connect the second capacitive device to the second connection node under control of the first functional block.

According to yet another embodiment of the invention, a method for sharing capacitive devices among multiple functional blocks includes: configuring a first coupling path comprising at least a first connection node and a second connection node, wherein the first connection node is connected to the second connection node and further connected to a first functional block; controlling a first capacitive device to connect to the first functional block when the first functional block is functioning, wherein the first capacitive device is disposed physically proximate the first functional block; and controlling a second capacitive device to connect to the second connection node when a second functional block is not functioning, wherein the second capacitive device is disposed physically proximate the second functional block.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
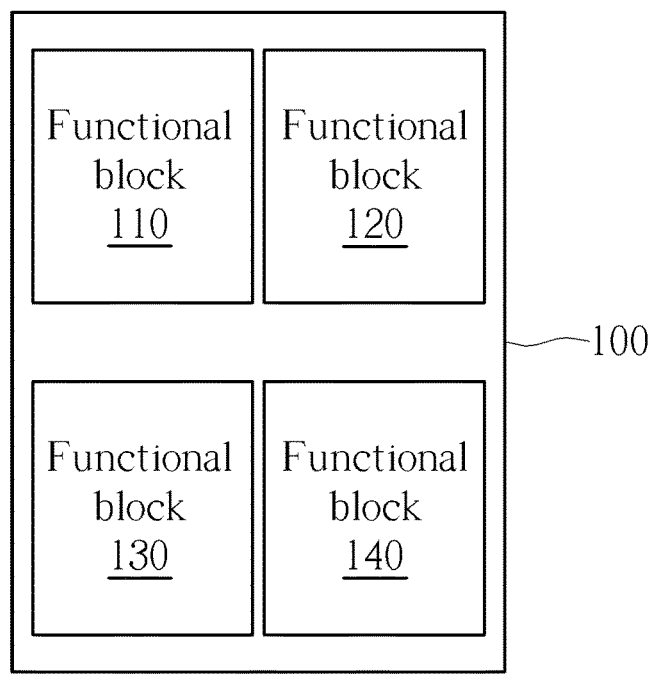
FIG. 1 shows an exemplary block diagram of a semiconductor device according to an embodiment of the invention.

FIG. 1 shows an exemplary block diagram of a semiconductor device according to an embodiment of the invention. The semiconductor device 100 may comprise multiple functional blocks, such as the functional blocks 110, 120, 130 and 140. Each functional block is configured to provide at least a predetermined function. In order to reduce the power noise and provide a relatively stable power supply, each functional block may be equipped with a corresponding capacitive device, such as a capacitor or a decoupling capacitor, disposed physically proximate the corresponding functional block.

Figure 2:
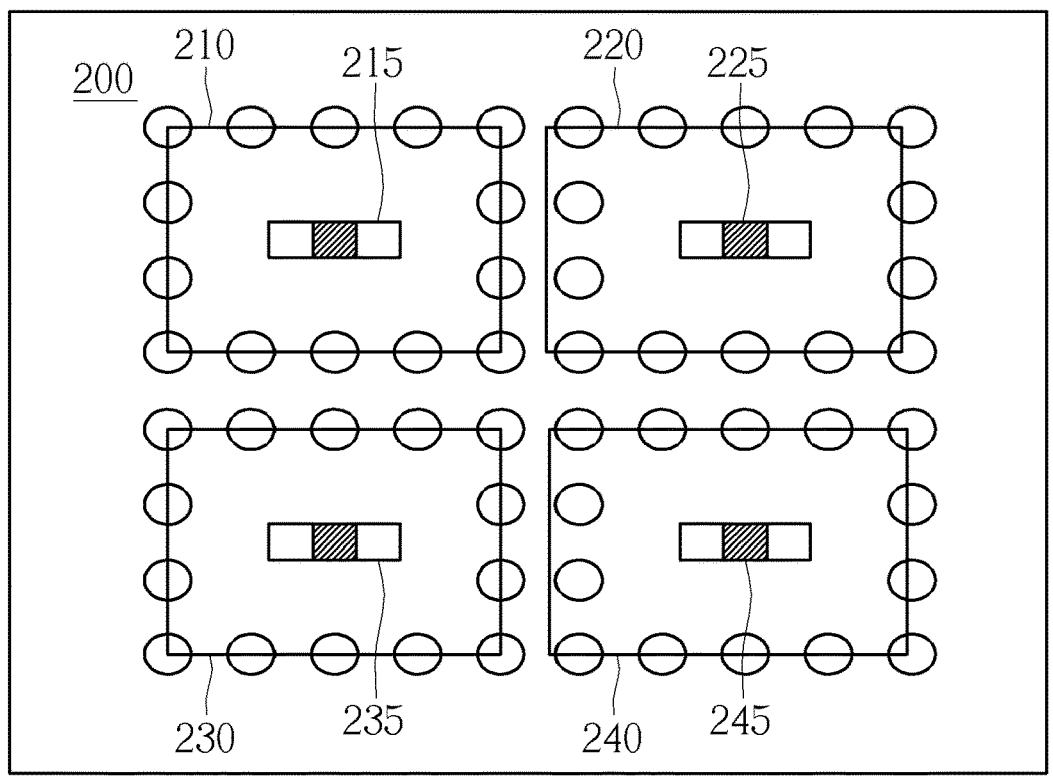
FIG. 2 shows an exemplary perspective view of a semiconductor device according to an embodiment of the invention.

FIG. 2 shows an exemplary perspective view of a semiconductor device according to an embodiment of the invention. In the embodiments of the invention, each functional block may be implemented as a silicon die, such as the silicon dies 210, 220, 230 and 240. The silicon dies 210, 220, 230 and 240 may be disposed on a substrate or a thin film redistribution layer (RDL), depending on the process and/or packaging technology, and the substrate or the thin film RDL may be further connected to a printed circuit board (PCB) via solder balls.

According to an embodiment of the invention, each silicon die may be equipped with a corresponding capacitive device, such as the capacitive device 215, 225, 235 and 245. The capacitive device 215 is disposed physically proximate the silicon die 210 (as well as the corresponding functional block). The capacitive device 225 is disposed physically proximate the silicon die 220 (as well as the corresponding functional block). The capacitive device 235 is disposed physically proximate the silicon die 230 (as well as the corresponding functional block). The capacitive device 245 is disposed physically proximate the silicon die 240 (as well as the corresponding functional block). In the embodiments of the invention, the capacitive device 215, 225, 235 and 245 may be implemented as the capacitors attached on the land side under the die shadow (land-side capacitor, LSC) or adjacent to the die side (die-side capacitor, DSC).

Figure 3:
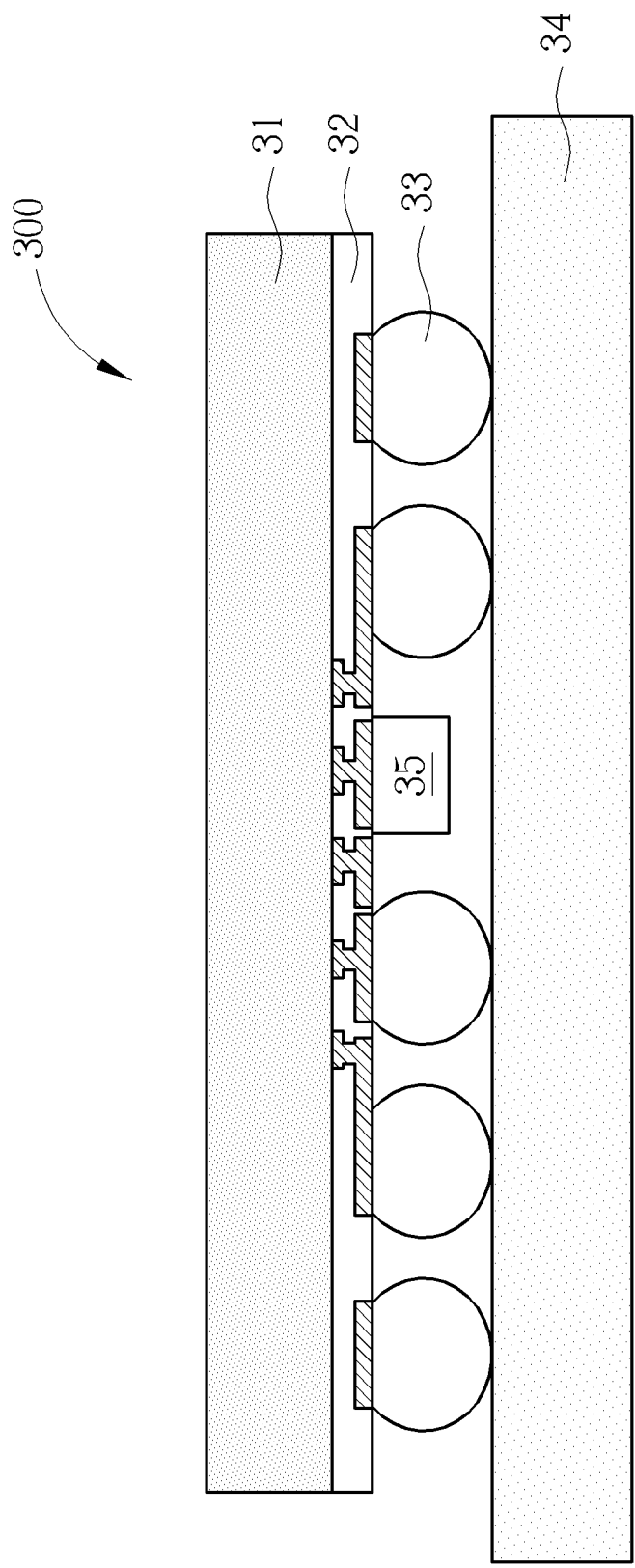
FIG. 3 shows an exemplary section view of a semiconductor device according to an embodiment of the invention.

FIG. 3 shows an exemplary section view of a semiconductor device, for illustrating one possible placement of the capacitive device when adopting the Fan-Out Wafer-Level Packaging (WLP) technology, according to an embodiment of the invention. The semiconductor device 300 may comprise a silicon die 31 disposed on one side of the thin film RDL 32. The capacitive device 35 physically proximate the silicon die 31 may be disposed on an opposite side of the thin film RDL 32. The thin film RDL 32 may be connected to the PCB 34 via one or more solder balls 33. In this embodiment, the capacitive device 35 may be a decoupling capacitor configured for the silicon die 31 to reduce the power noise and provide a relatively stable power supply. The silicon die 31 in FIG. 3 may be any of the silicon dies 210, 220, 230 and 240 in FIG. 2, and the capacitive device 35 in FIG. 3 may be any of the corresponding capacitive devices 215, 225, 235 and 245 in FIG. 2.

Figure 4:
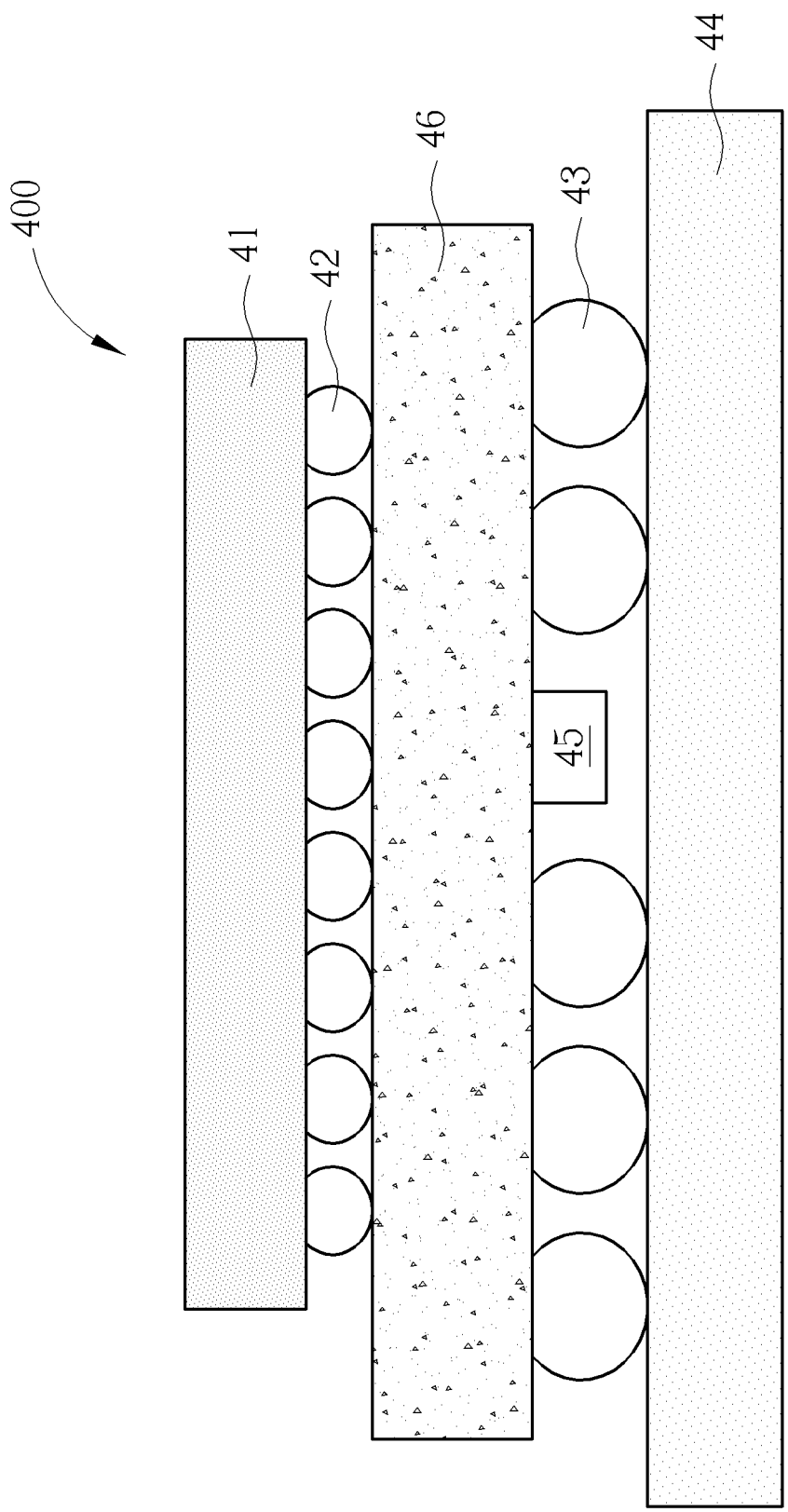
FIG. 4 shows an exemplary section view of a semiconductor device according to another embodiment of the invention.

FIG. 4 shows an exemplary section view of a semiconductor device, for illustrating another possible placement of the capacitive device when adopting the flip chip packaging technology, according to another embodiment of the invention. The semiconductor device 400 may comprise a silicon die 41 disposed on a flip chip substrate 46. The silicon die 41 may be connected to one side of the flip chip substrate 46 via one or more solder balls 42. The capacitive device 45 physically proximate the silicon die 41 may be disposed on an opposite side of the flip chip substrate 46. The flip chip substrate 46 may be connected to the PCB 44 via one or more solder balls 43. In this embodiment, the capacitive device 45 may be a decoupling capacitor configured for the silicon die 41 to reduce the power noise and provide a relatively stable power supply. The silicon die 41 in FIG. 4 may be any of the silicon dies 210, 220, 230 and 240 in FIG. 2, and the capacitive device 45 in FIG. 4 may be any of the corresponding capacitive devices 215, 225, 235 and 245 in FIG. 2.

According to an embodiment of the invention, in order to provide flexibility in capacitor design so as to achieve better electrical performance for a semiconductor device, one or more coupling paths may be introduced and configured in the corresponding semiconductor device, so as to implement the proposed method for sharing the capacitive devices among multiple functional blocks or silicon dies.

Figure 5:
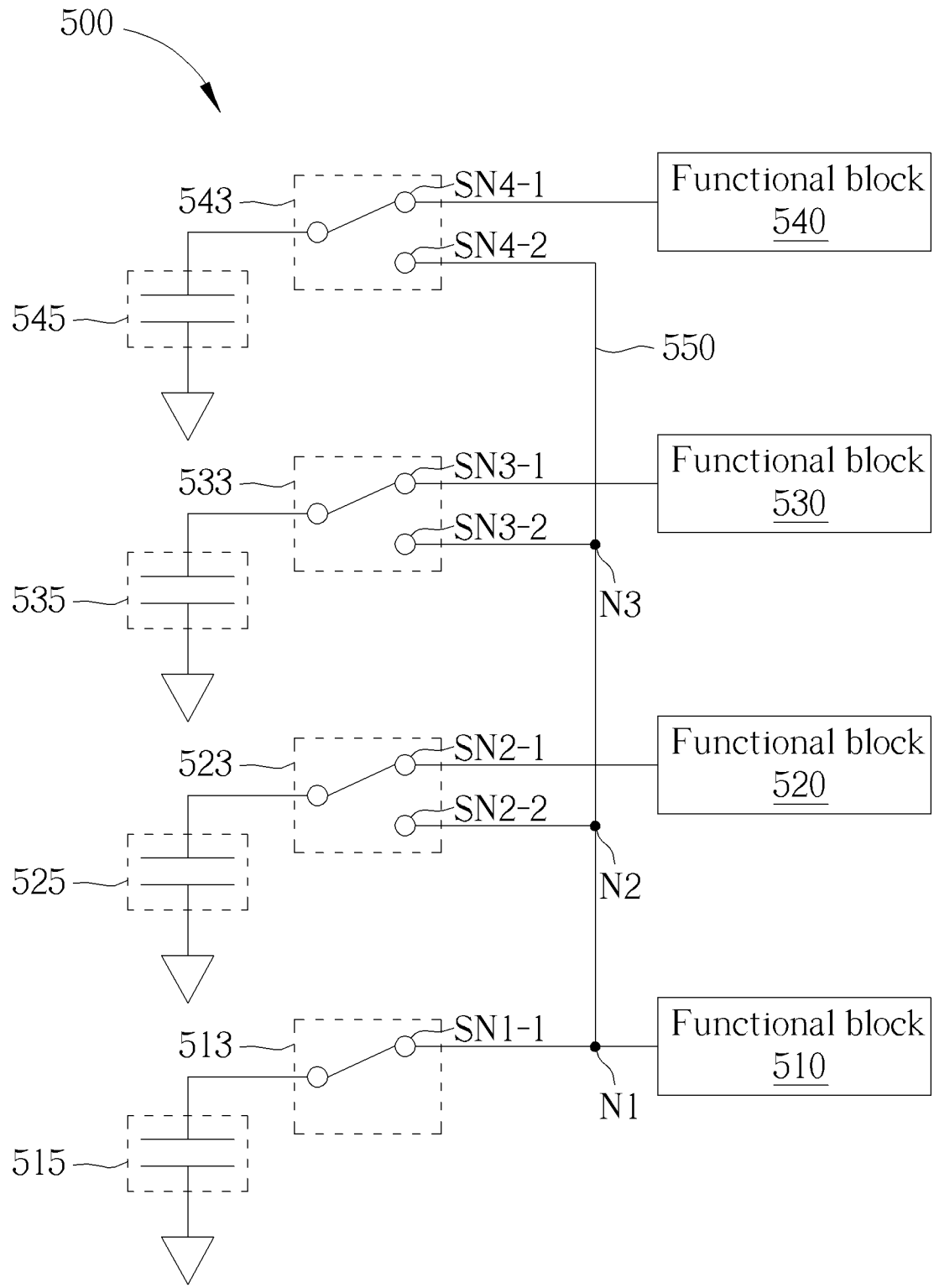
FIG. 5 is a schematic diagram showing the equivalent circuit of a semiconductor device with one coupling path configured for sharing the capacitive devices among multiple functional blocks according to an embodiment of the invention.

FIG. 5 is a schematic diagram showing the equivalent circuit of a semiconductor device with one coupling path configured for sharing the capacitive devices among multiple functional blocks according to an embodiment of the invention. The semiconductor device 500 may comprise functional blocks 510, 520, 530 and 540, capacitive devices 515, 525, 535 and 545, switch devices 513, 523, 533 and 543 and a coupling path 550.

Each functional block is configured to provide at least a predetermined function and is equipped with a corresponding capacitive device, such as a capacitor or a decoupling capacitor, disposed physically proximate the corresponding functional block. As an example, the capacitive device 515 is disposed physically proximate the functional block 510, the capacitive device 525 is disposed physically proximate the functional block 520, the capacitive device 535 is disposed physically proximate the functional block 530 and the capacitive device 545 is disposed physically proximate the functional block 540. The way to make a capacitive device physically proximate to a functional block may refer to the schematic diagram as shown in FIG. 3 or FIG. 4.

The coupling path 550 may comprise connection nodes N1, N2 and N3, where the connection nodes N1, N2 and N3 are all connected to the functional block 510. The switch device 513 is connected to the capacitive device 515 and is controlled to selectively connect the capacitive device 515 to the connection node N1. The switch device 523 is connected to the capacitive device 525 and is controlled to selectively connect the capacitive device 525 to the functional block 520 or the connection node N2. To be more specific, the switch device 523 may be controlled to connect the capacitive device 525 to the switching node SN2-1 or the switching node SN2-2, where the switching node SN2-1 is connected to the functional block 520 and the switching node SN2-2 is connected to the connection node N2.

Similarly, the switch device 533 is connected to the capacitive device 535 and is controlled to selectively connect the capacitive device 535 to the functional block 530 or the connection node N3. To be more specific, the switch device 533 may be controlled to connect the capacitive device 535 to the switching node SN3-1 or the switching node SN3-2, where the switching node SN3-1 is connected to the functional block 530 and the switching node SN3-2 is connected to the connection node N3. Similarly, the switch device 543 may be controlled to connect the capacitive device 545 to the switching node SN4-1 or the switching node SN4-2, where the switching node SN4-1 is connected to the functional block 540 and the switching node SN4-2 is connected to the connection node N3.

According to an embodiment of the invention, the semiconductor device 500 may be a multi-core processor chip, and the functional blocks 510~540 may be respectively a processing core of the multi-core processor chip. According to another embodiment of the invention, the semiconductor device 500 may be a chip device, and the functional blocks 510~540 may be different processing units, as examples but not limited to, the Central Processing Unit (CPU), the Graphic Processing Unit (GPU), the Neural Processing Unit (NPU) . . . etc., of the chip device. In an embodiment, the functional block 510 may be a master functional block, such as a big core or a master processing unit. However, whether to design one functional block as a master functional block is not a limit of the invention.

According to an embodiment of the invention, when any of the functional blocks 520~540 is not functioning or is functioning but performing a relatively light loading task, the corresponding switch devices 523~543 may be controlled, as an example but not limited to, under the control of the functional block 510, to connect the corresponding capacitive devices 525~545 to the switching nodes SN2-2~SN4-2, thereby coupling the corresponding capacitive device to the connection node N2 and/or N3 (as well as to the connection node N1 and the functional block 510).

To be more specific, when functional block 520 is not functioning or is functioning but performing a relatively light loading task, the switch device 523 may be controlled, as an example but not limited to, under the control of the functional block 510, to connect the capacitive device 525 to the switching node SN2-2, thereby coupling the corresponding capacitive device 525 to the connection node N2, which will be then connected to the connection node N1 and the functional block 510. In this manner, the capacitive device 525 configured for the functional block 520 is shared with and provided for the functional block 510 as a supplementary capacitive device thereof. The mechanisms of controlling the switch devices 533 and 543 may be deduced by analogy.

Note that in an embodiment of the invention, when the functional block 510 is functioning and when more than one of the functional blocks 520~540 are not functioning or are functioning but performing a relatively light loading task, more than one of the capacitive devices configured for the corresponding functional blocks 520~540 may be shared with and provided for the functional block 510 in the similar manner. In the embodiments of the invention, to connect how many capacitive devices to the functional block 510 may be flexibly controlled based on the actual loading of the functional block 510.

According to another embodiment of the invention, when any of the functional blocks 520~540 is not functioning or is functioning but performing a relatively light loading task, and when the functional block 510 is determined functioning in a relatively heavy load condition, the switch devices 523~543 may be controlled, as an example but not limited to, under the control of the functional block 510, to connect the corresponding capacitive devices 525~545 to the switching nodes SN2-2~SN4-2, thereby coupling the corresponding capacitive device to the connection node N2 and/or N3 (as well as to the connection node N1 and the functional block 510).

To be more specific, when functional block 520 is not functioning or is functioning but performing a relatively light loading task and when the functional block 510 is determined functioning in a relatively heavy load condition, the switch device 523 may be controlled, as an example but not limited to, under the control of the functional block 510, to connect the capacitive device 525 to the switching node SN2-2, thereby coupling the corresponding capacitive device 525 to the connection node N2, and then to the connection node N1 and the functional block 510. In this manner, the capacitive device 525 configured for the functional block 520 is shared with and provided for the functional block 510 as a supplementary capacitive device thereof. The mechanisms of controlling the switch devices 533 and 543 may be deduced by analogy.

Similarly, in an embodiment of the invention, when the functional block 510 is functioning in a relatively heavy load condition and when more than one of the functional blocks 520~540 are not functioning or are functioning but performing a relatively light loading task, the capacitive devices corresponding to said more than one of the functional blocks 520~540 may be flexibly controlled to be connected to the functional block 510.

According to an embodiment of the invention, 4 levels, such as level 1~level 4, may be set to define the loading of the functional block 510. When the functional block 510 is determined functioning in the load condition of level 1, no supplementary capacitive device is required. When the functional block 510 is determined functioning in the load condition of level 2, one supplementary capacitive device may be required. When the functional block 510 is determined functioning in the load condition of level 3, two supplementary capacitive devices may be required. When the functional block 510 is determined functioning in the load condition of level 4, three supplementary capacitive devices may be required. When one or more supplementary capacitive devices are required, the corresponding number of switch devices may be controlled to connect the corresponding capacitive devices to the functional block 510 via the corresponding switching nodes, connection nodes and the coupling path 550 by the way as described above.

According to another embodiment of the invention, 4 share conditions, such as share condition 1~share condition 4, may be set to define how to share the capacitive devices with the functional block 510. As an example, when all the functional blocks are functioning, the share condition 1 is satisfied and no capacitive device will be shared with the functional block 510. When one functional block is not functioning, the share condition 2 is satisfied and the capacitive device corresponding to (that is, configured for) the non-functioning functional block, will be shared with and provided for the functional block 510 via the corresponding switching node, connection node and coupling path 550 by the way as described above. When two functional blocks are not functioning, the share condition 3 is satisfied and the capacitive devices corresponding to (that is, configured for) the non-functioning functional blocks, will be shared with and provided for the functional block 510 via the corresponding switching nodes, connection nodes and coupling path 550 by the way as described above. When three functional blocks are not functioning, the share condition 4 is satisfied and the capacitive devices corresponding to (that is, configured for) the non-functioning functional blocks, will be shared with and provided for the functional block 510 via the corresponding switching nodes, connection nodes and coupling path 550 by the way as described above.

It is to be noted that although four functional blocks and four corresponding capacitive devices and switch devices are utilized in the examples for the ease of expression, the number of functional blocks as well as the corresponding capacitive devices and switch devices should not be limited to four, and may be any positive integer greater than 1.

Figure 6:
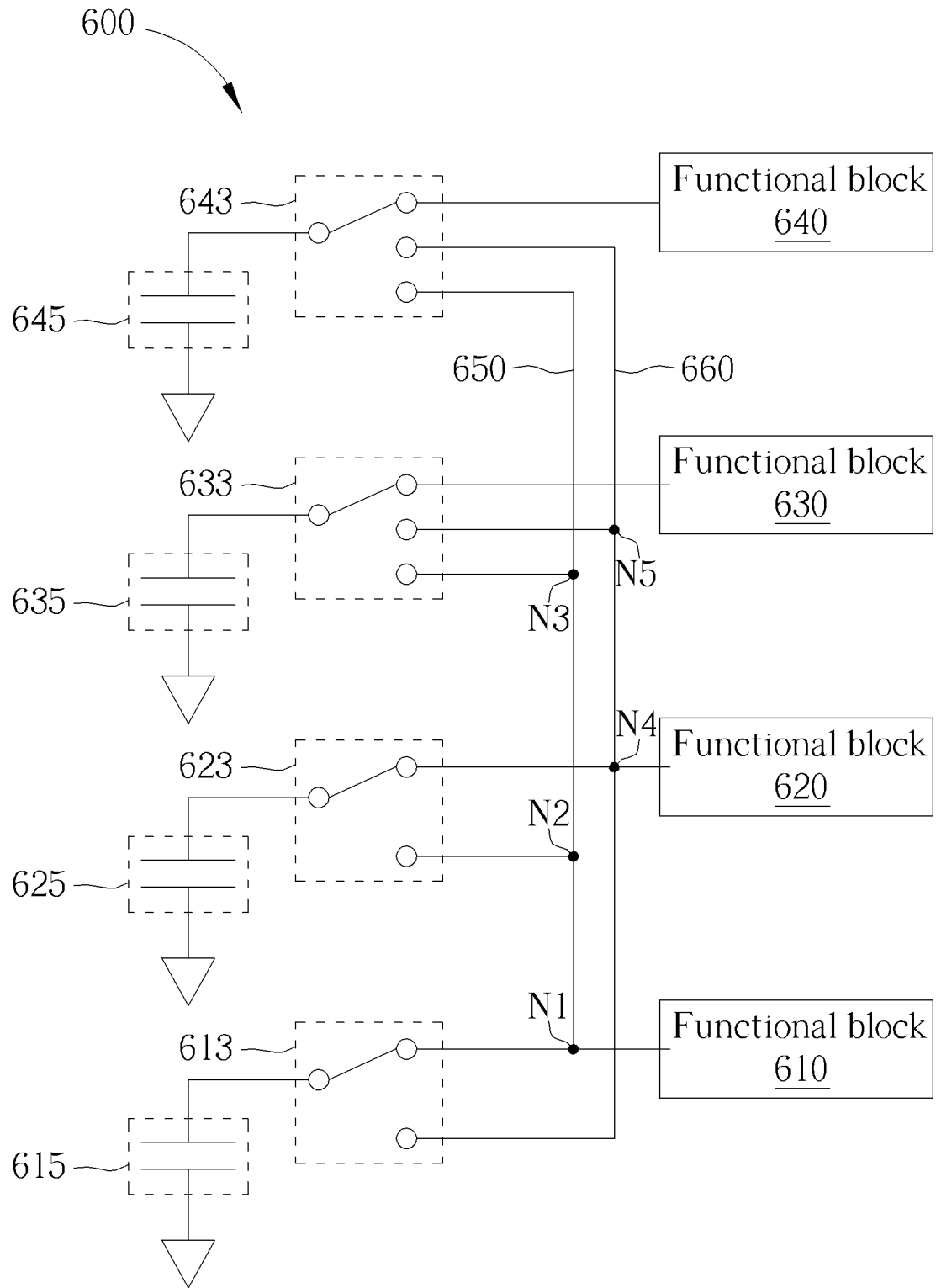
FIG. 6 is a schematic diagram showing the equivalent circuit of a semiconductor device with two coupling paths configured for sharing the capacitive devices among multiple functional blocks according to another embodiment of the invention.

FIG. 6 is a schematic diagram showing the equivalent circuit of a semiconductor device with two coupling paths configured for sharing the capacitive devices among multiple functional blocks according to another embodiment of the invention. The semiconductor device 600 may comprise functional blocks 610, 620, 630 and 640, capacitive devices 615, 625, 635 and 645, switch devices 613, 623, 633 and 643 and two coupling paths 650 and 660.

The equivalent circuit of the semiconductor device 600 is similar to that of the semiconductor device 500, except for that one more coupling path 660 is introduced. The coupling path 660 may comprise connection nodes N4 and N5, where the connection nodes N4 and N5 are all connected to the functional block 620. Like reference numbers in FIG. 5 and FIG. 6 may indicate similar or functionally similar elements. Therefore, some descriptions are omitted here for brevity.

The switch device 613 is connected to the capacitive device 615 and is controlled to selectively connect the capacitive device 615 to the connection node N1 or connection node N4. The switch device 623 is connected to the capacitive device 625 and is controlled to selectively connect the capacitive device 625 to the connection node N2 or the connection node N4. The switch device 633 is connected to the capacitive device 635 and is controlled to selectively connect the capacitive device 635 to the functional block 630, the connection node N3 or the connection node N5. The switch device 643 is connected to the capacitive device 645 and is controlled to selectively connect the capacitive device 645 to the functional block 640, the connection node N3 or the connection node N5.

Noted that in this embodiment, the switch devices 633 and 643 may be controlled to be switched among three switching nodes. In addition, noted that different from the embodiment shown in FIG. 5, in this embodiment, the switch device 613 may be further controlled to selectively connect the capacitive device 615 to the connection node N1 or the fourth connection node N4, and when the second functional block is determined in a heavy load condition, the switch device 613 may be controlled to connect the capacitive device 615 to the connection node N2, and then to the functional block 620. In this manner, the capacitive device 615 configured for the functional block 610 is shared with and provided to the functional block 620 as a supplementary capacitive device thereof. The mechanisms of controlling the switch devices 633 and 643 may be deduced by analogy.

According to an embodiment of the invention, the semiconductor device 600 may be a multi-core processor chip, and the functional blocks 610~640 may be respectively a processing core of the multi-core processor chip. According to another embodiment of the invention, the semiconductor device 600 may be a chip device, and the functional blocks 610~640 may be different processing units, as examples but not limited to, the CPU, the GPU, the NPU . . . etc., of the chip device. In an embodiment, the functional block 610 may be a master functional block, such as a big core or a master processing unit. However, whether to design one functional block as a master functional block is not a limit of the invention.

Similarly, according to an embodiment of the invention, in order to provide supplementary capacitive device to the functional block 620, when any of the functional blocks 610, 630 and 640 is not functioning or is functioning but performing a relatively light loading task, the corresponding switch devices 613, 633 and 643 may be controlled, as an example but not limited to, under the control of the functional block 620 or the functional block 610, to connect the corresponding capacitive devices 615, 635 and 645 to the connection nodes N4 or N5 (and then to the functional block 620).

According to another embodiment of the invention, when any of the functional blocks 610, 630 and 640 is not functioning or is functioning but performing a relatively light loading task, and when the functional block 620 is determined functioning in a relatively heavy load condition, the switch devices 613, 633 and 643 may be controlled, as an example but not limited to, under the control of the functional block 620 or the functional block 610, to connect the corresponding capacitive devices 615, 635 and 645 to the connection nodes N4 or N5 (and then to the functional block 620).

In an embodiment of the invention, when the functional block 620 is functioning (or, functioning in a relatively heavy load condition) and when more than one of the functional blocks 610, 630 and 640 are not functioning or are functioning but performing a relatively light loading task, the capacitive devices corresponding to said more than one of the functional blocks 610, 630 and 640 may be flexibly controlled to be connected to the functional block 620.

Regarding the mechanism of using multiple levels to define the loading of the functional block 620 and then controlling the switch devices corresponding to the remaining functional blocks to connect the corresponding capacitive devices to the functional block 620 via the switching nodes, connection nodes and the coupling path 660, reference may be made to the paragraphs with respect to FIG. 5, and are omitted here for brevity.

Similarly, regarding the mechanism of using multiple share conditions to define how to share the capacitive devices with the functional block 620 and then controlling the switch devices corresponding to the remaining functional blocks to connect the corresponding capacitive devices to the functional block 620 via the switching nodes, connection nodes and the coupling path 660, reference may be made to the corresponding paragraphs with respect to FIG. 5, and are omitted here for brevity.

According to an embodiment of the invention, the coupling paths 550, 650 and 660 may be implemented by traces, cooper or metal lines or any other signal transmission lines.

It is to be noted again that although four functional blocks and four corresponding capacitive devices and switch devices are utilized in the examples for the ease of expression, the number of functional blocks as well as the corresponding capacitive devices and switch devices should not be limited to four, and may be any positive integer greater than 1.

In addition, although one or two coupling paths are utilized in the examples for expression, the invention should not be limited thereto. Since those skilled in the art will readily derive the structure of the semiconductor device with more than two coupling paths based on the teachings of FIG. 5 and FIG. 6, the corresponding drawing and descriptions are omitted here for brevity.

Figure 7:
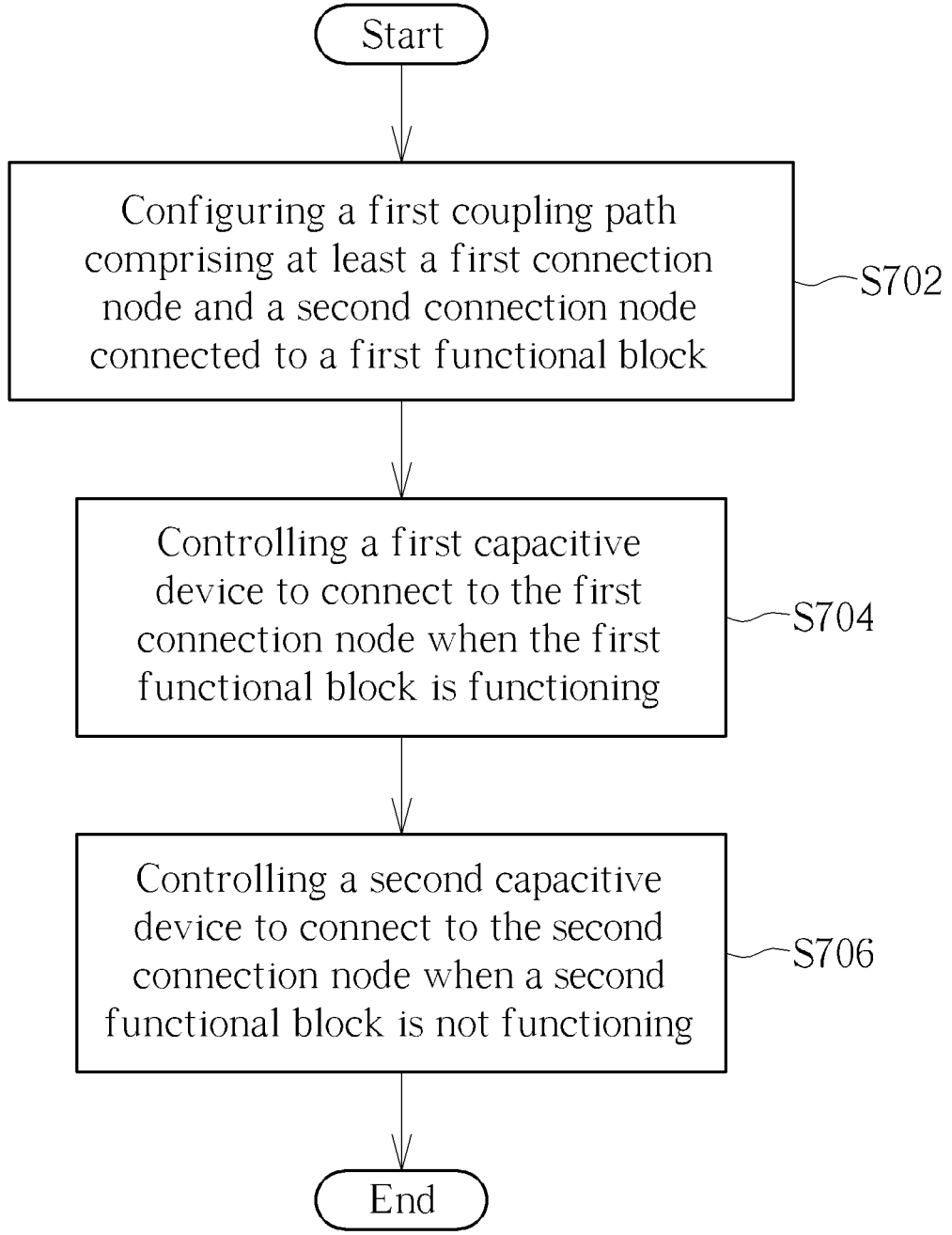
FIG. 7 shows an exemplary flow chart of a method or sharing capacitive devices among multiple functional blocks according to an embodiment of the invention.

FIG. 7 shows an exemplary flow chart of a method or sharing capacitive devices among multiple functional blocks according to an embodiment of the invention. The proposed method may comprise the following steps:

Step S702: Configuring a first coupling path comprising at least a first connection node and a second connection node connected to a first functional block.

Step S704: Controlling a first capacitive device to connect to the first connection node as well as the first functional block when the first functional block is functioning, wherein the first capacitive device is disposed physically proximate the first functional block.

Step S706: Controlling a second capacitive device to connect to the second connection node when a second functional block is not functioning, wherein the second capacitive device is disposed physically proximate the second functional block.

In some embodiments of the invention, Step S706 may further comprise: determining whether the first functional block is in a heavy load condition; and controlling the second capacitive device to connect to the second connection node when the first functional block is determined in the heavy load condition.

In addition, in some embodiments of the invention, the method may further comprise an optional step: controlling a third capacitive device to connect to a third connection node when a third functional block is not functioning, wherein the third connection node is disposed on the first coupling path and connecting to the first connection node and the third capacitive device is disposed physically proximate the third functional block.

In addition, in some embodiments of the invention, the method may further comprise some optional steps: configuring a second coupling path comprising at least a fourth connection node, wherein the fourth connection node is connected to the second functional block; controlling the second capacitive device to connect to the fourth connection node when the second functional block is functioning; controlling the first capacitive device to connect to the fourth connection node when the first functional block is not functioning; and controlling a third capacitive device to connect to a fifth connection node when a third functional block is not functioning, wherein the fifth connection node is disposed on the second coupling path and connecting to the fourth connection node and the third capacitive device is disposed physically proximate the third functional block.

Based on the proposed structures of a semiconductor device with flexibility in capacitor design, better electrical performance is achieved by sharing capacitive devices among functional blocks for one or more of the capacitive devices to be provided as supplementary capacitive devices when required.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a first functional block, configured to provide at least a first predetermined function;
   a second functional block, configured to provide at least a second predetermined function;
   a first capacitive device, disposed physically proximate the first functional block;
   a second capacitive device, disposed physically proximate the second functional block;
   a first coupling path, comprising at least a first connection node connecting to the first functional block;
   a first switch device, coupled to the first capacitive device and being controlled to selectively connect the first capacitive device to the first connection node; and
   a second switch device, coupled to the second capacitive device and being controlled to selectively connect the second capacitive device to the second functional block or a second connection node,
   wherein the second connection node is disposed on the first coupling path and connecting to the first connection node, and
   wherein the second switch device is controlled to connect the second capacitive device to the second connection node under control of the first functional block.

2. The semiconductor device of claim 1, wherein when the first functional block is determined in a heavy load condition, the second switch device is controlled to connect the second capacitive device to the second connection node.

3. The semiconductor device of claim 1, further comprising:
   a third functional block, configured to provide at least a third predetermined function;
   a third capacitive device, disposed physically proximate the third functional block; and
   a third switch device, coupled to the third capacitive device and being controlled to selectively connect the third capacitive device to the third functional block or a third connection node,
   wherein the third connection node is disposed on the first coupling path and connecting to the first connection node.

4. The semiconductor device of claim 3, wherein when the first functional block is determined in a heavy load condition, the third switch device is controlled to connect the third capacitive device to the third connection node.

5. The semiconductor device of claim 1, further comprising:
   a second coupling path, comprising at least a fourth connection node connecting to the second functional block,
   wherein the first switch device is further controlled to selectively connect the first capacitive device to the first connection node or the fourth connection node, and when the second functional block is determined in a heavy load condition, the first switch device is controlled to connect the first capacitive device to the fourth connection node.

6. The semiconductor device of claim 3, further comprising:
   a second coupling path, comprising at least a fourth connection node connecting to the second functional block,
   wherein the third switch device is further controlled to selectively connect the third capacitive device to the third functional block, the third connection node or a fifth connection node, and
   wherein the fifth connection node is disposed on the second coupling path and connecting to the fourth connection node, and when the second functional block is determined in a heavy load condition, the third switch device is controlled to connect the third capacitive device to the fifth connection node.

7. The semiconductor device of claim 1, wherein the semiconductor device is a multi-core processor chip, and the first functional block and the second functional block are respectively a processing core of the multi-core processor chip.

8. The semiconductor device of claim 1, wherein the semiconductor device is a chip device, and the first functional block and the second functional block are different processing units of the chip device.

9. A semiconductor device, comprising:
   a first functional block, configured to provide at least a first predetermined function;
   a second functional block, configured to provide at least a second predetermined function;
   a first capacitive device, disposed physically proximate the first functional block;
   a second capacitive device, disposed physically proximate the second functional block;
   a first coupling path, comprising at least a first connection node connecting to the first functional block;
   a first switch device, coupled to the first capacitive device and being controlled to selectively connect the first capacitive device to the first connection node; and a second switch device, coupled to the second capacitive device and being controlled to selectively connect the second capacitive device to the second functional block or a second connection node, wherein the second connection node is disposed on the first coupling path and connecting to the first connection node, and wherein when the first functional block is determined in a heavy load condition, the second switch device is controlled to connect the second capacitive device to the second connection node under control of the first functional block.

10. The semiconductor device of claim 9, further comprising:

a third functional block, configured to provide at least a third predetermined function;

a third capacitive device, disposed physically proximate the third functional block; and a third switch device, coupled to the third capacitive device and being controlled to selectively connect the third capacitive device to the third functional block or a third connection node, wherein the third connection node is disposed on the first coupling path and connecting to the first connection node, and when the first functional block is determined in the heavy load condition, the third switch device is controlled to connect the third capacitive device to the third connection node under the control of the first functional block.

11. The semiconductor device of claim 9, further comprising:

a second coupling path, comprising at least a fourth connection node connecting to the second functional block, wherein the first switch device is further controlled to selectively connect the first capacitive device to the first connection node or the fourth connection node, and when the second functional block is determined in a heavy load condition, the first switch device is controlled to connect the first capacitive device to the fourth connection node under the control of the first functional block.

12. The semiconductor device of claim 10, further comprising:

a second coupling path, comprising at least a fourth connection node connecting to the second functional block, wherein the third switch device is further controlled to selectively connect the third capacitive device to the third functional block, the third connection node or a fifth connection node, and wherein the fifth connection node is disposed on the second coupling path and connecting to the fourth connection node, and when the second functional block is determined in a heavy load condition, the third switch device is controlled to connect the third capacitive device to the fifth connection node under the control of the first functional block.

13. The semiconductor device of claim 9, wherein the semiconductor device is a multi-core processor chip, and the first functional block and the second functional block are respectively a processing core of the multi-core processor chip.

14. The semiconductor device of claim 9, wherein the semiconductor device is a chip device, and the first functional block and the second functional block are different processing units of the chip device.

15. A method for sharing capacitive devices among multiple functional blocks, comprising:

configuring a first coupling path comprising at least a first connection node and a second connection node, wherein the first connection node is connected to the second connection node and further connected to a first functional block;

controlling a first capacitive device to connect to the first functional block when the first functional block is functioning, wherein the first capacitive device is disposed physically proximate the first functional block; and controlling a second capacitive device to connect to the second connection node when a second functional block is not functioning, wherein the second capacitive device is disposed physically proximate the second functional block and wherein the second capacitive device is controlled to connect to the second connection node under control of the first functional block.

16. The method of claim 15, wherein step of controlling the second capacitive device to connect to the second connection node when the second functional block is not functioning further comprises:

determining whether the first functional block is in a heavy load condition; and controlling the second capacitive device to connect to the second connection node when the first functional block is determined in the heavy load condition.

17. The method of claim 15, further comprising:

controlling a third capacitive device to connect to a third connection node when a third functional block is not functioning, wherein the third connection node is disposed on the first coupling path and connecting to the first connection node and the third capacitive device is disposed physically proximate the third functional block.

18. The method of claim 15, further comprising:

configuring a second coupling path comprising at least a fourth connection node, wherein the fourth connection node is connected to the second functional block;

controlling the second capacitive device to connect to the fourth connection node when the second functional block is functioning;

controlling the first capacitive device to connect to the fourth connection node when the first functional block is not functioning; and controlling a third capacitive device to connect to a fifth connection node when a third functional block is not functioning, wherein the fifth connection node is disposed on the second coupling path and connecting to the fourth connection node and the third capacitive device is disposed physically proximate the third functional block.

19. The method of claim 15, wherein the first functional block and the second functional block are respectively a processing core comprised in a multi-core processor chip.

20. The method of claim 15, wherein the first functional block and the second functional block are different processing units of a chip device.

* * * * *